(12) United States Patent
Koazechi et al.

(10) Patent No.: US 9,231,598 B2
(45) Date of Patent: *Jan. 5, 2016

(54) MULTIPLEXED OSCILLATORS

(71) Applicant: Renesas Electronics Corporation, Kanagawa (JP)

(72) Inventors: Shinichi Koazechi, Kanagawa (JP); Tatsufumi Kurokawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/611,660

(22) Filed: Feb. 2, 2015

(65) Prior Publication Data
US 2015/0145561 A1  May 28, 2015

Related U.S. Application Data

(63) Continuation of application No. 14/087,201, filed on Nov. 22, 2013, now Pat. No. 8,970,277.

(30) Foreign Application Priority Data

Feb. 18, 2013  (JP) .................. 2013-029373

(51) Int. Cl.
*H03K 3/013* (2006.01)
*G01R 23/00* (2006.01)
*H03L 7/00* (2006.01)
*G06F 1/06* (2006.01)
*G06F 1/08* (2006.01)
*G06F 1/28* (2006.01)

(52) U.S. Cl.
CPC .. *H03L 7/00* (2013.01); *G06F 1/06* (2013.01); *G06F 1/08* (2013.01); *G06F 1/28* (2013.01)

(58) Field of Classification Search
CPC .................................................... G01R 23/005
USPC .............. 327/40–43, 291, 292, 298, 526, 592
See application file for complete search history.

(56) References Cited

U.S. PATENT DOCUMENTS 5,406,231 A  4/1995  Jylha
8,140,918 B2  3/2012  Kanaya et al.

FOREIGN PATENT DOCUMENTS

JP  2006-252086 A  9/2006
JP  2010-205154 A  9/2010

*Primary Examiner* — William Hernandez
(74) *Attorney, Agent, or Firm* — Sughrue Mion, PLLC

(57) ABSTRACT

An integrated circuit device for use in an automobile. The integrated circuit device includes a first oscillator configured to generate a first clock signal, a second oscillator configured to generate a second clock signal, a comparator circuit configured to compare a frequency of the first clock signal with a frequency of the second clock signal, and configured to generate a selection signal for selecting either of the first clock signal or the second clock signal, and a selector configured to output an output clock signal that is selected from among a plurality of outputs including the first clock signal and the second clock signal in response to the select signal.

16 Claims, 14 Drawing Sheets

FIG. 5
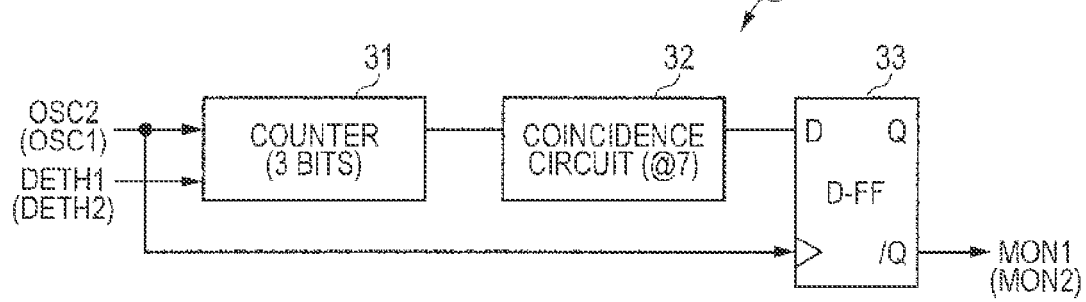
FIG. 6
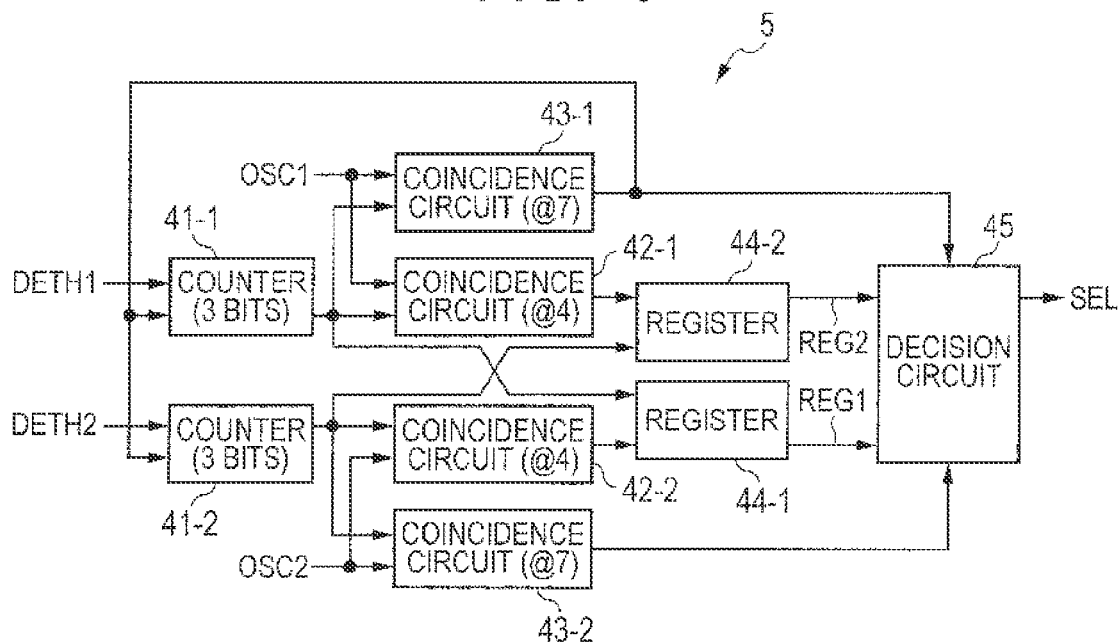
FIG. 7
| COMPARISON RESULTS | SEL |
|---|---|
| REG1−REG2 ≥ 2 | LOW |
| REG1−RFG2 IS −1 TO 1 | HIGH |
| REG1−REG2 ≤ −2 | HIGH |

| OSC1GD | OSC2GD | SEL | CLKGD | CLKOUT |
|---|---|---|---|---|
| LOW | LOW | — | LOW | LOW |
| HIGH | LOW | — | LOW | = OSC1 |
| LOW | HIGH | — | LOW | = OSC2 |
| HIGH | HIGH | LOW | HIGH | = OSC2 |
|  |  | HIGH | HIGH | = OSC1 |

| COMPARISON RESULTS | SEL |
|---|---|
| REG1−REG2 ≥ 2 | HIGH |
| REG1−RFG2 IS −1 TO 1 | HIGH |
| REG1−REG2 ≤ −2 | LOW |

| COMPARISON RESULTS | SEL | SW1 | SW2 |
|---|---|---|---|
| REG1−REG2 ≥ 2 | LOW | LOW | HIGH |
| REG1−REG2 IS −1 TO 1 | HIGH | HIGH | HIGH |
| REG1−REG2 ≤ −2 | HIGH | HIGH | LOW |

MULTIPLEXED OSCILLATORS

CROSS-REFERENCE TO RELATED APPLICATIONS

This is a continuation application of U.S. patent application Ser. No. 14/087,201, filed on Nov. 22, 2013, which claims priority from Japanese Patent Application No. 2013-029373 filed on Feb. 18, 2013, the specifications, drawings and abstracts of which are incorporated herein by reference in their entirety.

BACKGROUND

The present invention relates to an integrated circuit device, and relates in particular to an integrated circuit device having multiplexed oscillators.

Integrated circuit devices require a high level of functional safety. In-vehicle ICs (integrated circuits) for example require a high level of functional safety, and functional safety relating to automobile electrical and electronic functions are established as an international standard in IS026262.

Functional safety generally includes the following stages. Stage 1: detect abnormalities and stop operation. Stage 2: Maintain operation by switching to a correctly operating circuit when an abnormality is detected. Manufacturers of automobiles and electrical equipment are currently proceeding to achieve stage 1 while aiming to attain stage 2 in the future and to achieve those functions.

Amidst these circumstances, in-vehicle IC is also currently required to have functional safety when an abnormality occurs in the internal circuits. Progress is being made among in-vehicle IC for example towards (circuit) redundancy and so on, with designs that stop operation if there is an abnormality in one (circuit). Moreover, even higher safety performance is being demanded for in-vehicle IC and the goal is to achieve the second stage.

The oscillator is one of the main elements in the integrated circuit and demands are also being made for functional safety in the oscillator. This state has led to proposals for semiconductor devices configured from multiplexed oscillators.

A multiplexed timer device containing three oscillators for example is disclosed in Japanese Unexamined Patent Application Publication No. 2006-252086. The multiplexed timer device disclosed in this publication contains three oscillators and three timer counters coupled to the respective oscillators. The timer device is designed to compare the count values from each of the timer counters with an average count value for the three timer counters, and select the count value nearest the average value for use as a timer output signal. The timer device is capable of detecting a breakdown or lower accuracy in one timer counter, and also utilizing the timer counter among the three timer counters having the highest accuracy to continue operation.

The above multiplexed timer device however operates by comparing the count value with the average value so that the structure requires three or more oscillators. This larger number of oscillators is not preferable due to the resulting increased circuit scale.

A technology on the other hand disclosing an information processing device having a multiplexed clock system utilizing two oscillators is disclosed in Japanese Unexamined Patent Application Publication No. 2010-205154. The information processing device in this publication contains two clock boards respectively including the clock source, and a plurality of system boards. One of the two clock boards is utilized to generate operation clock (pulses) and other clock board is utilized to generate standby clock. These generated operation clocks and standby clocks are supplied to each system board. Each system board contains a clock detector circuit to detect whether or not operation clocks are being supplied. When the clock detector circuit detects that there are no operation clocks (or stoppage of the operation clock), the information processing device switches the clock being used from the (current) operation clock to the standby clock.

SUMMARY

However, in the technology disclosed in the Japanese Unexamined Patent Application Publication No. 2010-205154, the clock detector circuit can detect stoppage of the operation clock (namely, oscillation of the oscillator used in generating the operation clocks has stopped) but cannot detect the frequency of the operating clock or in other words cannot detect an excessive rise or drop in the clock source oscillator frequency. This inability is a problem when the oscillator characteristics are considered. Oscillators typically have a characteristic in which the oscillator frequency fluctuates due to deterioration occurring over a long-term operation. More specifically, an oscillator with one structure has the characteristic that the oscillator frequency rises after long-term operation, and an oscillator with another structure has the characteristic that the oscillator frequency drops after long-term operation. The oscillator is preferably multiplexed for handling an excess rise or an excess drop in the oscillation frequency even in the case of a rise or a drop in the oscillation frequency. The technology disclosed in Japanese Unexamined Patent Application Publication No. 2010-205154 is not capable of dealing with a rise or a drop in the oscillation frequency after long-term operation.

The technology of the related art therefore has the problem of being unable to simultaneously satisfy a need to lower the number of the oscillators and a need to handle excessive fluctuations in oscillation frequency.

The other issues and novel features of the present invention will become readily apparent from the description of the invention and the accompanying drawings.

The integrated circuit device of one embodiment includes two oscillators for generating a first clock signal, and a second clock signal. The integrated circuit device is designed to compare the frequencies of both the first clock signal and the second clock signal and to monitor whether or not the respective frequencies are within the frequency tolerance range. The output clock signal is selected from the first clock signal or the second clock signal according to the results comparing the first clock signal and second clock signal frequencies, and whether each of the first clock signal and the second clock signal are within the frequency tolerance range.

The integrated circuit device having multiplexed oscillators of the above embodiment is capable of simultaneously satisfying a need to lower the number of oscillators and a need to handle excessive fluctuations in oscillation frequency.

BRIEF DESCRIPTION OF THE DRAWINGS

FIG. 5 is a block diagram showing the structure of the monitor circuit in one embodiment;

FIG. 6 is a block diagram showing the structure of the comparator circuit in one embodiment;

FIG. 7 is a truth table showing the operation of the decision circuit for the comparator circuit of one embodiment;

DETAILED DESCRIPTION

Figure 1:
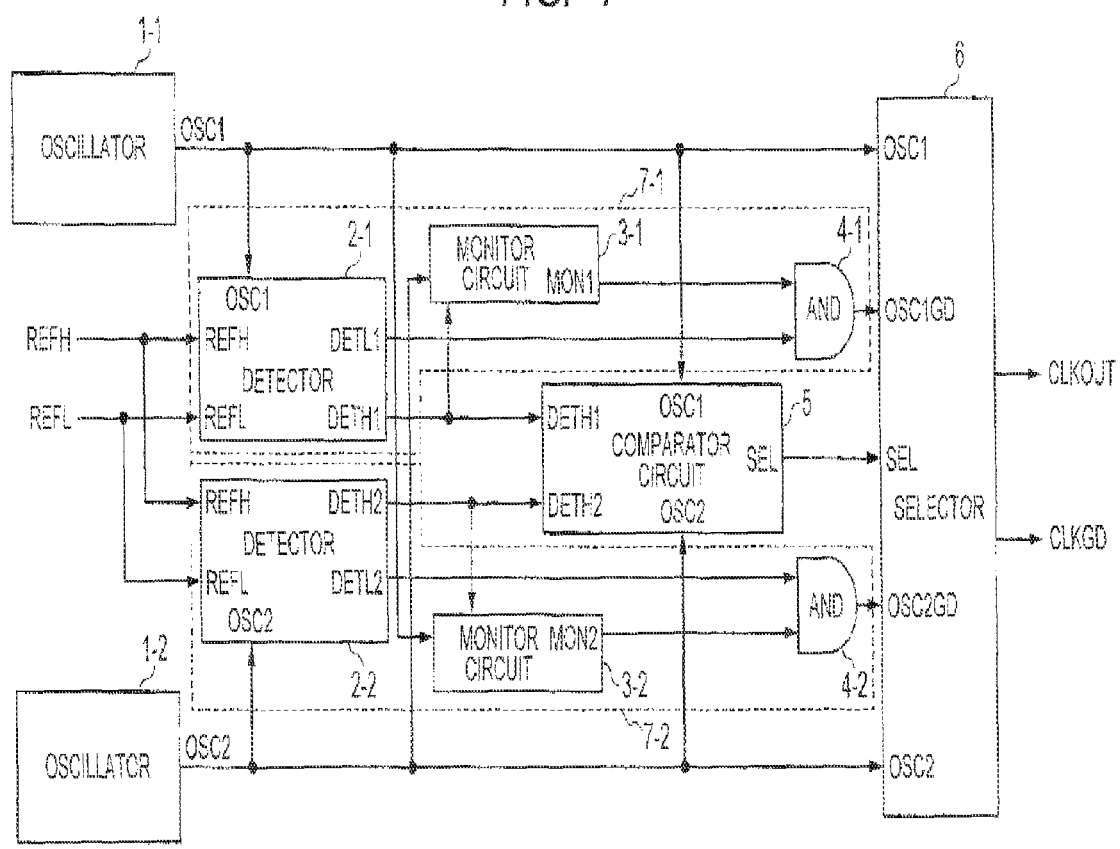
FIG. 1 is a block diagram showing the structure of the integrated circuit device of one embodiment.

FIG. 1 is a block diagram showing the structure of the integrated circuit device of one embodiment. The integrated circuit device of the present embodiment is configured as a clock generator circuit containing two oscillators 1-1, 1-2, detectors 2-1, 2-2, monitor circuits 3-1, 3-2, AND gates 4-1, 4-2, a comparator circuit 5, and a selector 6.

Each circuit in the relevant clock generator circuit operates generally as shown below. The oscillators 1-1, 1-2 respectively generate the clock signals OSC1, OSC2. The oscillators 1-1 and 1-2 are each independently controlled and adjusted to attain roughly the same frequency. The detector 2-1, monitor circuit 3-1, and AND gate 4-1 configure a first frequency monitor unit 7-1 to monitor whether or not the frequency of the clock signal OSC1 is within the specified frequency tolerance range (allowable frequency range from the clock generator circuit specifications). The detector 2-2, monitor circuit 3-2, and AND gate 4-2 in the same way configure a second frequency monitor unit 7-2 to check whether or not the frequency of the clock signal OSC2 is within the frequency tolerance range. The comparator circuit 5 compares the frequencies of the clock signals OSC1, OSC2 of the oscillator 1-1, 1-2. The selector 6 selects one of the clock signals OSC1, OSC2, and outputs the selected clock signal as the output clock signal CLKOUT.

As described in detail later on, in the present embodiment the oscillation frequency (namely the frequency of the clock signals OSC1, OSC2) is structured so as to rise due to deterioration in operation of the oscillators 1-1, 1-2. Basically, the selector 6 selects the clock signal generated by the oscillator having minimal deterioration or namely selects a clock signal having a low frequency. However, when the frequency of one of the clock signals OSC1, OSC2 is not within the frequency tolerance range, the selector 6 selects the other clock signal as the output clock signal CLKOUT. Also, if both frequencies of the clock signals OSC1 and OSC2 are not within the frequency tolerance range, the selector 6 does not output an output clock signal CLKOUT. In this case, the selector 6 clamps the output terminal outputting the output clock signal CLKOUT to a specified state (e.g. low level or high impedance state).

The clock generator circuit of the present embodiment configure as described above is designed to monitor the respective frequencies, along with comparing the frequencies of the clock signals OSC1, OSC2 and so is capable of switching the clock signal when an error (abnormality) occurs by utilizing a structure having fewer oscillators (or namely, a structure utilizing only two oscillators). The clock generator circuit of the present embodiment is therefore capable of simultaneously satisfying the need to lower the number of the oscillators and the need to handle excessive fluctuations in the oscillation frequency. The structure and operation of each circuit in the clock generator circuit in the present embodiment is descried next in detail.

Figure 2:
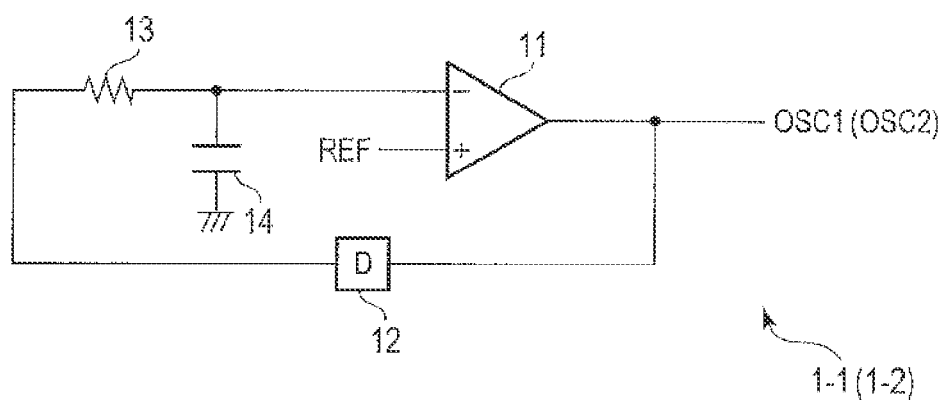
FIG. 2 is a circuit diagram showing the structure of the oscillator of one embodiment.

FIG. 2 is a circuit diagram showing an example of the structure of the oscillators 1-1, 1-2. In FIG. 2, the structure of the oscillator 1-1 is shown in the figure but the oscillator 1-2 also has the same structure. The oscillators 1-1, 1-2 of the present embodiment each include an operational amplifier 11, a delay element 12, a resistor element 13 and a capacitor element 14. The delay element 12 and the resistor element 13 are coupled in series between the output and the inverting input of the operational amplifier 11; and the capacitor element 14 is coupled across the inverting input of the operational amplifier 11 and the ground terminal. A reference voltage potential REF having a specified voltage level is input to the non-inverting input (normal input) of the operational amplifier 11. The delay element 12, resistor element 13, and the capacitor element 14 form a positive feedback loop in the oscillators 1-1, 1-2 having this type of structure, and the clock signals OSC1 or OSC2 are output from the output of the operation amplifier 11. The oscillation frequency of the oscillator having the structure in FIG. 2 is dependent on the capacitance of the capacitor element 14, and the larger the capacitance of capacitor element 14, the lower the oscillation frequency.

In the oscillators 1-1, 1-2 having this type of structure, the oscillation frequency rises due to long-term operation. In the case of the clock generator circuit of the present embodiment integrated into the semiconductor device, typically a MOS (metal oxide semiconductor) capacitor, and more typically a capacitor with a MIS (metal insulator semiconductor) structure is utilized as the capacitor element 14. When a MOS capacitor is utilized as the capacitor element 14, and the oscillators 1-1, 1-2 are operated for a long time, the capacitance of the capacitor element 14 decreases due to deterioration. Consequently, the oscillation frequency of the oscillators 1-1, 1-2 having the structure in FIG. 2 rises due to the long-term operation. Namely, when one oscillation frequency among the oscillators 1-1, 1-2 is low, then that relevant oscillator has minimal deterioration.

Figure 3:
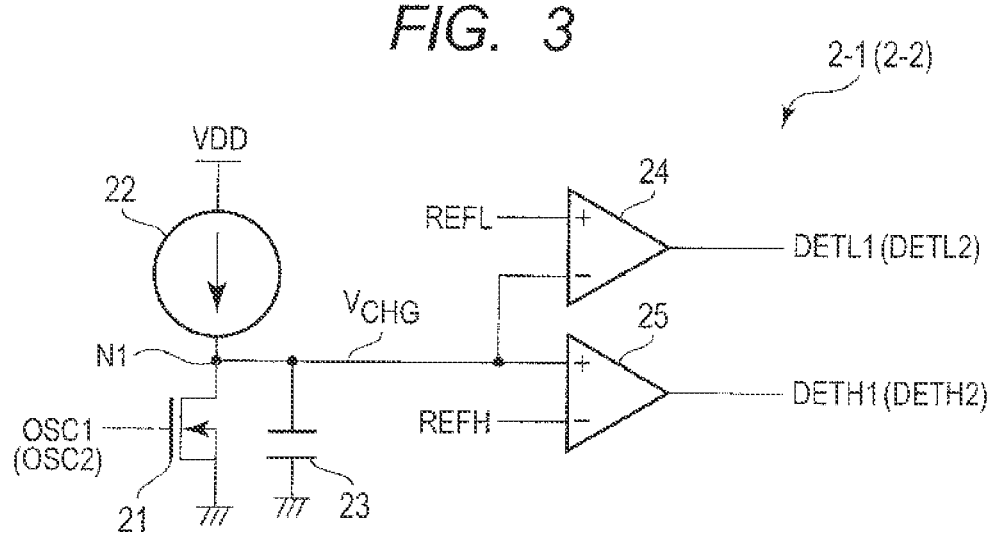
FIG. 3 is a circuit diagram showing the structure of the detector of one embodiment.

The oscillator 2-1 generates detection signals DETL1, DETH1 including waveforms dependent on the frequency of the clock signal OSC1, and the oscillator 2-2 generates detection signals DETL2, DETH2 having waveforms dependent on the frequency of the clock signal OSC2. FIG. 3 is a circuit diagram showing an example of the structure of the detector circuit 2-1. The detector 2-2 is also the same structure and only the input and output signals are different. The detector 2-1 includes an NMOS transistor 21, a constant current source 22, a capacitor element 23, and the operational amplifiers 24, utilized as the comparator. The source of the NMOS transistor 21 is coupled to the ground terminal, that drain is coupled to the node N1, and a clock signal OSC1 is supplied to the gate. The constant current source 22 coupled between the power supply terminal and the node N1. The capacitor element 23 is coupled between the node N1 and the ground terminal. The reference voltage potential REFL is supplied to the non-inverting input of the operational amplifier 24, and the inverting input is coupled to the node N1. The non-inverting input of the operational amplifier 25 is coupled to the node N1, and the reference voltage potential REFH is supplied to the inverting input. Here, the reference voltage potential REFL and REFH are set so that the reference voltage potential REFL is higher than the reference voltage potential REFH. The output signal from the operation amplifier 24 is utilized as the detection signal DETL1, and the output signal from the operational amplifier 25 is utilized as the detection signal DETH1.

The detector 2-1 having this type of structure, generates the detection signals DETL1, DETH1 including waveforms dependent on the frequency of the clock signal OSC1. The detection signal DETL1 here has a waveform dependent on whether or not the frequency of the clock signal OSC1 is higher than a specified lower limit frequency $f_L$, and the detection signal DETH1 has a waveform dependent on whether or not the frequency of the clock signal OSC1 is higher than a specified upper limit frequency $f_H$. When the frequency range from the lower limit frequency $f_L$ to the upper limit frequency $f_H$ is set as the frequency tolerance range of the clock signal OSC1, the clock signal OSC1 can be judged as within the frequency tolerance range or not by monitoring the detection signal DETL1, DETH1 waveforms.

Here, the lower limit frequency $f_L$ is set as dependent on the reference voltage potential REFL, and the upper limit frequency $f_H$ is set as dependent on the reference voltage potential REFH. This dependence signifies that the lower limit frequency $f_L$ and the upper limit frequency $f_H$ for the frequency tolerance range can be set by adjusting the reference voltage potential REFL and REFH.

Figure 4A:
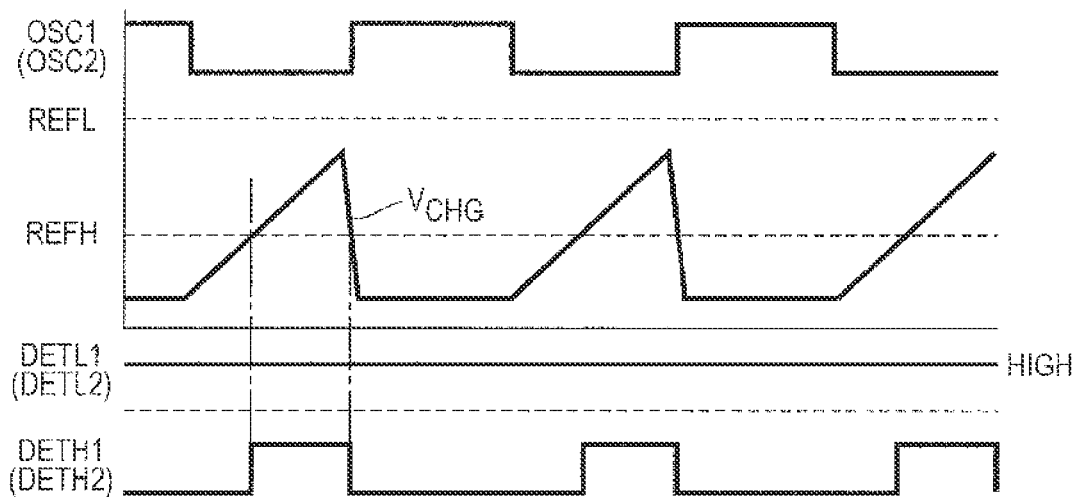
FIG. 4A is a timing chart showing the operation of the detector in FIG. 3 for the case when the frequency of the clock signal is within the frequency tolerance range.
Figure 4B:
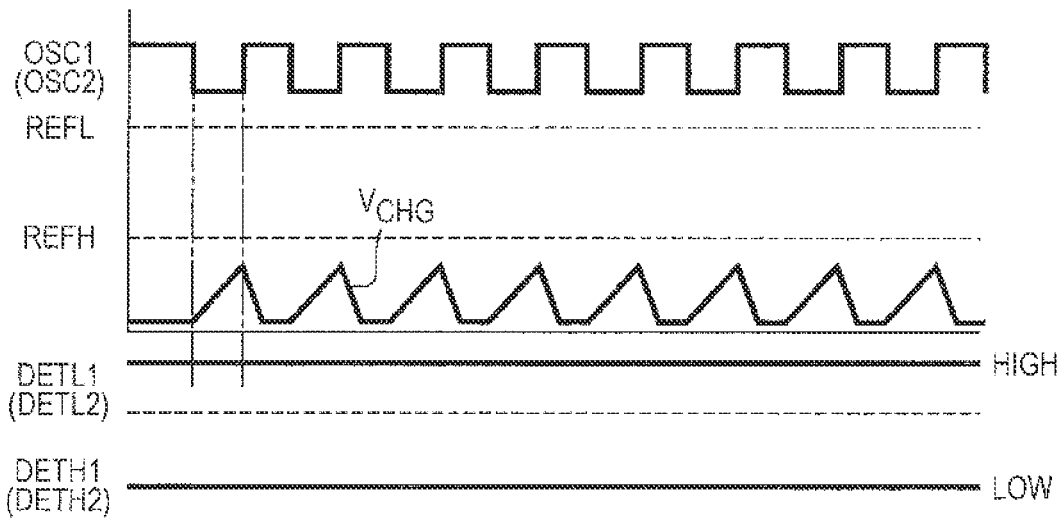
FIG. 4B is a timing chart showing the operation of the detector in FIG. 3 for the case when the frequency of the clock signal is higher than the upper limit frequency of the frequency tolerance range.
Figure 4C:
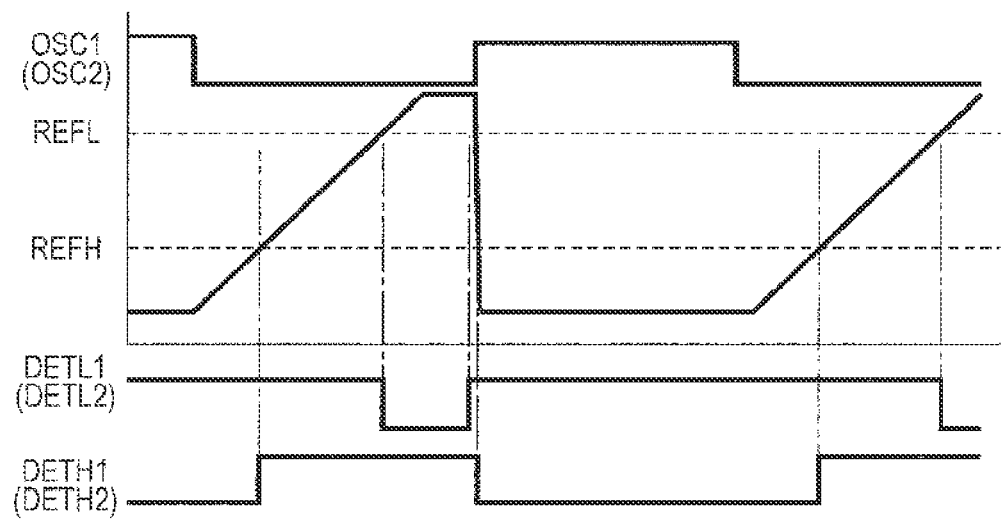
FIG. 4C is a timing chart showing the operation of the detector in FIG. 3 for the case when the frequency of the clock signal is lower than the lower limit frequency of the frequency tolerance range.
Figure 4D:
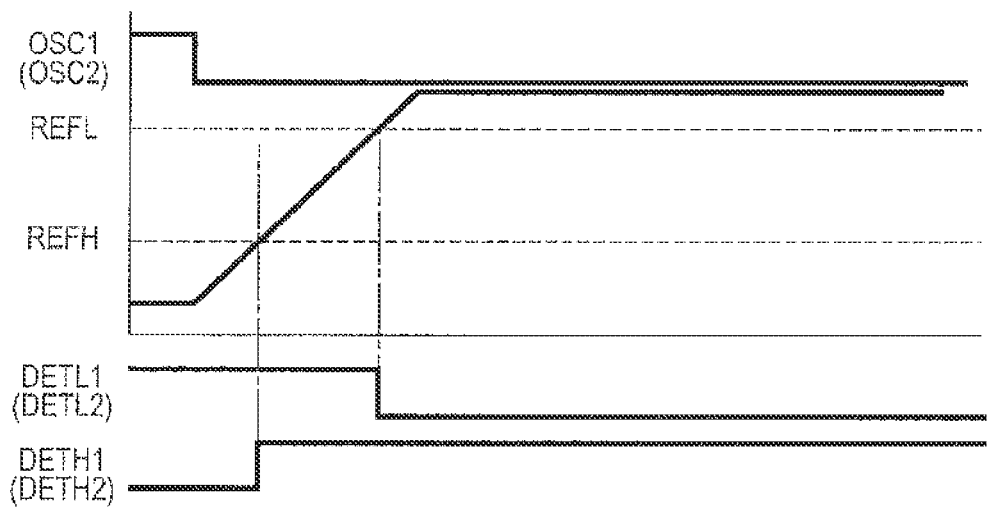
FIG. 4D is a timing chart showing the operation of the detector in FIG. 3 for the case when the clock signal is clamped at the low level.

FIG. 4A through 4D are timing charts showing the operation of the detector 2-1 with the structure of FIG. 3, and also showing the relation between the frequency of the clock signal OSC1 and the waveforms of the detection signals DETL1, DETH1. Here, FIG. 4A shows the operation of the detector 2-1 when the frequency of the clock signal OSC1 is higher than the lower limit frequency $f_L$ and lower than the upper limit frequency $f_H$ (in other words, within the frequency tolerance range). FIG. 4B shows the operation of the detector 2-1 when the frequency of the clock signal OSC1 is higher than the upper limit frequency $f_H$. FIG. 4C shows the operation of the detector 2-1 when the frequency of the clock signal OSC1 is lower than the lower limit frequency $f_L$. FIG. 4D shows the operation of the detector 2-1 when the clock signal OSC1 is clamped at ground level. In FIG. 4A through 4D, $V_{CHG}$ indicates the voltage potential of node N1 (namely, the voltage to which the capacitor element 23 is charged).

In the period when the clock signal OSC1 is at high level, the NMOS transistor 21 reaches the ON state, and the capacitor element 23 is discharged. The node N1 voltage potential $V_{CHG}$ is in this way set to ground level. In this case, the node N1 voltage potential $V_{CHG}$ is lower than the reference voltage potential REFL so that the detection signal DETL1 output from the operational amplifier 24 reaches high level. The node N1 voltage potential $V_{CHG}$ is lower than the reference voltage potential REFH so that the detection signal DETL1 output from the operational amplifier 25 reaches low level.

The NMOS transistor 21 reaches the OFF state in the period when the clock signal OSC1 is low level, and the capacitor element 23 is charged by supplying the constant current output from the constant current source 22. The voltage potential $V_{CHG}$ of the node N1 is in this way raised at a fixed speed. The waveform of the voltage potential $V_{CHG}$ is in other words a ramp waveform. When the voltage potential $V_{CHG}$ of node N1 exceeds the reference voltage potential REFH the detection signal DETH1 transitions from low level to high level. When the voltage potential $V_{CHG}$ of node N1 exceeds the reference voltage potential REFL the detection signal DETL1 transitions from high level to low level. When the clock signal OSC1 returns to high level, the voltage potential $V_{CHG}$ of node N1 returns to ground level, the detection signal DETH1 returns to low level, and the detection signal DETL1 returns to high level.

As a result of the above type of operation, the detection signals DETL1, DETH1 are generated so as to have a waveform dependent on the frequency of the clock signal OSC1. More specifically, the detection signal DETL1 is clamped at a high level when the frequency of the clock signal OSC1 is higher than the lower limit frequency $f_L$, and at least temporarily reaches low level when lower than the lower limit frequency $f_L$. A detection signal DETL1 that reaches low level signifies that an error or abnormality in which the frequency of clock signal OSC1 is lower than the lower limit frequency $f_L$ is occurring.

The detection signal DETH1 is constantly at low level when the frequency of the clock signal OSC1 is higher than the upper limit frequency $f_H$, and when lower than the upper limit frequency $f_H$, becomes a signal with a pulse that appears at a specific frequency (in other words, a signal with repeating high levels and low levels at a specific frequency). Here, when the frequency of the clock signal OSC1 is lower than the upper limit frequency $f_H$, the frequency of the detection signal DETH1 matches the frequency of the clock signal OSC1. When the clock signal OSC1 is clamped at low level, the detection signal DETH1 becomes a signal clamped at high level. The monitor circuit 3-1 and the AND gate 4-1 contain a function to decide whether or not the frequency of the clock signal OSC1 is within the frequency tolerance range, from the detection signals DETL1, DETH1 having waveforms dependent on the frequency of the clock signal OSC1.

The detector 2-2 contains a structure identical to the detector 2-1 so that the detection signals DETL2, DETH2 are both generated in the same way to include a waveform dependent on the frequency of the clock signal OSC2. More specifically, the detection signal DETL2 is clamped at a high level when the frequency of the clock signal OSC2 is higher than the lower limit frequency $f_L$; and at least temporarily reaches low level when lower than the lower limit frequency $f_L$. The detection signal DETH2 is constantly at low level when the frequency of the clock signal OSC2 is higher than the upper limit frequency $f_H$, and when lower than the upper limit frequency $f_H$, becomes a signal with a pulse that appears at a specific frequency (in other words, a signal with repeating high levels and low levels at a specific frequency). Here, when the frequency of the clock signal OSC2 is lower than the upper limit frequency $f_H$, the frequency of the detection signal DETH2 matches the frequency of the clock signal OSC2. When the clock signal OSC2 is clamped at low level, the detection signal DETH2 becomes a signal clamped at high level. The monitor circuit 3-2 and the AND gate 4-2 contain a function to decide whether or not the frequency of the clock signal OSC2 is within the frequency tolerance range, from the detection signals DETL2, DETH2 having waveforms dependent on the frequency of the clock signal OSC2.

The monitor circuits 3-1, 3-2 respectively monitor the detection signals DETH1, DETH2, and generate monitor signals showing whether or not the clock signals OSC1, OSC2 are higher than the upper limit frequency $F_H$ in response to the detection signals DETH1, DETH2. FIG. 5 is a block diagram showing the structure of the monitor circuit 3-1. The monitor circuit 3-1 includes a counter 31, a coincidence circuit 32, and a D flip-flop 33. The counter 31 counts the clock pulses of the clock signal OSC2. Here the counter 31 is reset when the detection signal DETH1 transitions to high level. The coincidence circuit 32 is configured so that the output signal reaches high level when the count value of the counter 31 reaches a specified value. The coincidence circuit 32 output signal sets to low level when the count value on the counter 31 is below the specified value. The D flip-flop 33 is a signal that latches the output signal of the coincidence circuit 32 in synchronization with the clock signal OSC2. The signal output from the inverted output /Q of D flip-flop 33 is utilized as the monitor signal MON1.

In the present embodiment, a three bit counter is utilized as the counter 31. When the counter value on the counter 31 has reached 7 (="111"), the coincidence circuit 32 transitions the output signal to high level. In other words, the output signal of the coincidence circuit 32 reaches high level, and the monitor signal MON1 reaches low level, when the detection signal DETH1 is maintained at high level during the seven cycles of the clock signal OSC2. The monitor signal MON1 reaching low level signifies that an abnormality is occurring in which the frequency of the clock signal OSC1 is higher than the upper limit frequency $F_H$. The monitor circuit 3-2 also has a structure identical to the monitor circuit 3-1 and performs the same operation with only the input and output signals being different.

The AND gate 4-1 generates an output signal corresponding to the logical product (logical AND) of the detection signal DETL1 and the monitor signal MON1. The output signal from the AND gate 4-1 is utilized as the clock normal signal OSC1GD to show whether or not the frequency of the clock signal OSC1 is within the frequency tolerance range. When an abnormality has occurred, where the frequency of the clock signal OSC1 has deviated from the frequency tolerance range, one of at least either the detection signal DETL1 and monitor signal MON1 is at low level so the clock normal signal OSC1GD that is maintained constantly at high level signifies that the frequency of the clock signal OSC1 is within the frequency tolerance range. The AND gate 4-2 generates an output signal corresponding to the logical product (logical AND) of the detection signal DETL2 and the monitor signal MON2 in the same way. The output signal from the AND gate 4-2 is utilized as the clock normal signal OSC2GD that shows whether or not the frequency of the clock signal OSC2 is within the frequency tolerance range.

The comparator circuit 5 compares the frequencies of the clock signal OSC1 and OSC2 and outputs a selection signal SEL according to the comparison results. In the present embodiment, when no difference between the frequency of the clock signal OSC1 and the frequency of the clock signal OSC2 is detected, or when the frequency of the clock signal OSC1 is detected as lower than frequency of the clock signal OSC2, the selection signal SEL is set to high level. When the frequency of the clock signal OSC2 is detected as lower than the frequency of the clock signal OSC1, the selection signal SEL is set to low level.

FIG. 6 is a block diagram showing an example of the structure of the comparator circuit 5. The comparator circuit 5 includes the counters 41-1, 41-2, the coincidence circuits 42-1, 42-2, 43-1, 43-2, the registers 44-1, 44-2, and decision circuit 45.

The counter 41-1 counts the pulses from the detection signal DETH1 output from the detector 2-1. The counter 41-2 counts the pulses from the detection signal DETH2 output from the detector 2-2 in the same way. In the present embodiment, a three bit counter is utilized as the counters 41-1, 41-2. Here, the counters 41-1, 41-2 are reset in synchronization with the rising edge of the detection signal DETH1, when the output signal from the coincidence circuit 43-1 reaches the high level.

The coincidence circuits 42-1, 42-2 respectively monitor the count values of the counters 41-1, 41-2 in synchronization with the falling edge of the clock signals OSC1, OSC2. When the count values of the counters 41-1, 41-2 reach the specified setting value (in the present embodiment, "100")) when the respective clock signals OSC1, OSC2 have fallen, the output signals from the coincidence circuits 42-1, 42-2 are set to high level, and the output signals are set to low level when not at the specified setting value.

The coincidence circuits 43-1, 43-2 respectively monitor the count values from the counters 41-1, 41-2 in synchronization with the clock signals OSC1, OSC2. The output signals from the coincidence circuits 42-1, 42-2 are set to high level when the count value of the counters 41-1, 41-2 are at a specified setting value (in the present embodiment, "7" (="111")), and the output signals are set to low level when not at the specified setting value. Here, the coincidence circuits 43-1, 43-2 setting value are set to a larger setting value than the coincidence circuits 42-1, 42-2.

The register 44-1 latches the counter value from the counter 41-1 in synchronization with the rise (or rising edge) of the output signal from the coincidence circuit 42-2. The value latched by the register 44-1 is hereafter called the register value REG1. Here, important to note is that the register 44-1 latches the counter value of the counter 41-1 generated according to the detection signal DETH1 in synchronization with the output signal from the coincidence circuit 42-2 generated according to the detection signal DETH2. The register 44-2 in the same way latches the counter value of the counter 41-2 in synchronization with the rising edge of the output signal from the coincidence circuit 42-1. Hereafter, the value latched by the register 44-2 is called the register value REG2. Important to note is that the register 44-2 also latches the counter value for the counter 41-2 generated according to the detection signal DETH2 in synchronization with the output signal from the coincidence circuit 42-1 generated according to the detection signal DETH1.

When the output signal from at least one of the coincidence circuits 43-1, 43-2 reaches the high level, the decision circuit 45 compares the register values REG1, REG2, and generates an output signal corresponding to the comparison results from the register values REG1, REG2. The output signal from the decision circuit 45 is utilized as the selection signal SEL according to the comparison results of the frequencies of the clock signals OSC1, OSC2.

FIG. 7 is a truth table showing the operation of the decision circuit 45. The selection signal SEL is set to low level when the value of REG1−REG2 is higher than the first threshold value or more specifically is 2 or more. On the other hand when the value of REG1−REG2 is smaller than the first threshold value and larger than a second threshold value, or more specifically, when the REG1−REG2 value is −1 or more and also less than 1, the selection signal SEL is set to high level. Here, the second threshold value is a value smaller than the first threshold value, and in the present embodiment, the second threshold value is established as an absolute value equivalent to the first threshold value, and having an opposite sign. Furthermore, the selection signal SEL is set to high level when the REG1−REG2 value is the second threshold value or less or more specifically when the REG1−REG2 value is −2 or less.

Here, a REG1−REG2 value of 2 or more signifies that the frequency of the clock signal OSC1 was detected as significantly higher (namely, there is large deterioration in the oscillator 1-1 generating the clock signal OSC1) than the frequency of the clock signal OSC2. Also, a REG1−REG2 value of −2 or less signifies that the frequency of the clock signal OSC2 was detected as significantly higher than the frequency of the clock signal OSC1 (namely, there is large deterioration in the oscillator 1-2 generating the clock signal OSC2). A REG1−REG2 value of −1 or more and 1 or less signifies that no significant difference was detected between the clock signals OSC1, OSC2.

Figure 8A:
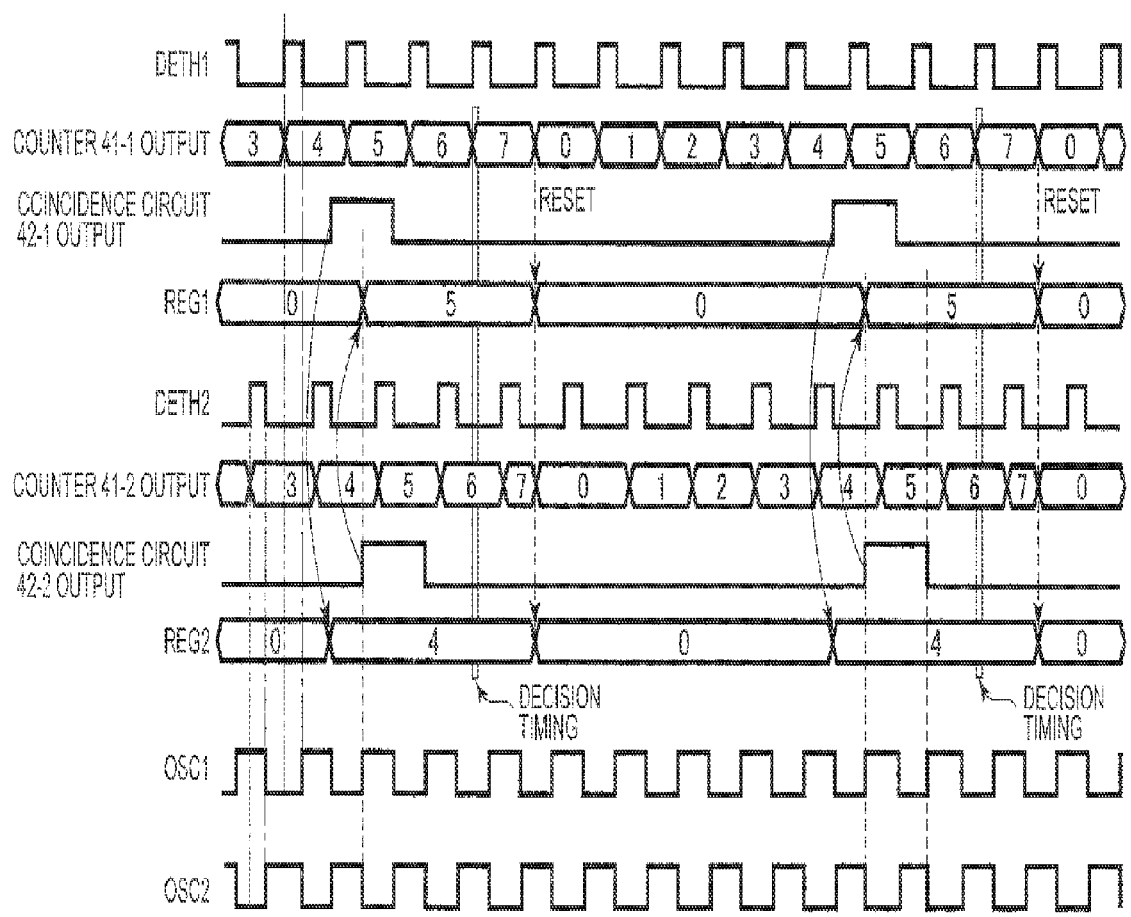
FIG. 8A is a timing chart showing the operation of the comparator circuit of one embodiment for the case when no significant difference was detected between the frequencies of the two clock signals.
Figure 8B:
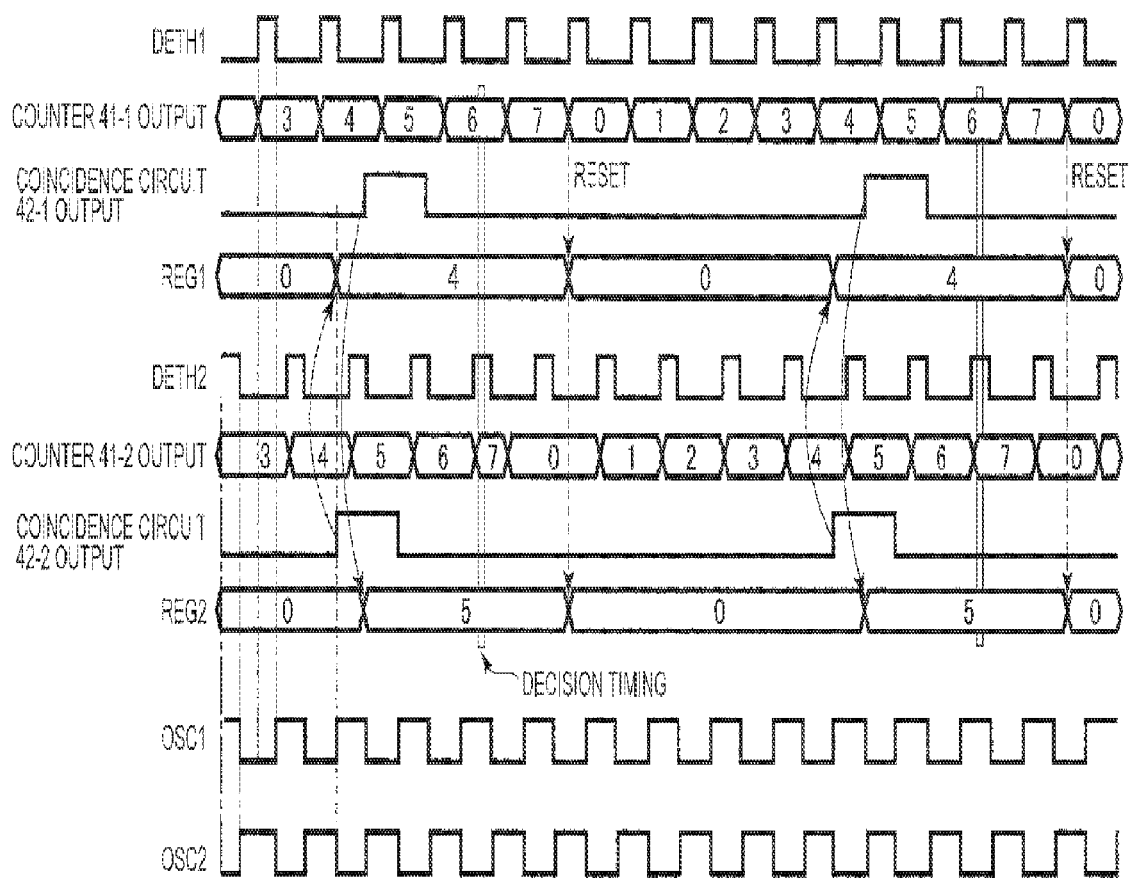
FIG. 8B is a timing chart showing the operation of the comparator circuit of one embodiment for the case when no significant difference was detected between the frequencies of the two clock signals.
Figure 9:
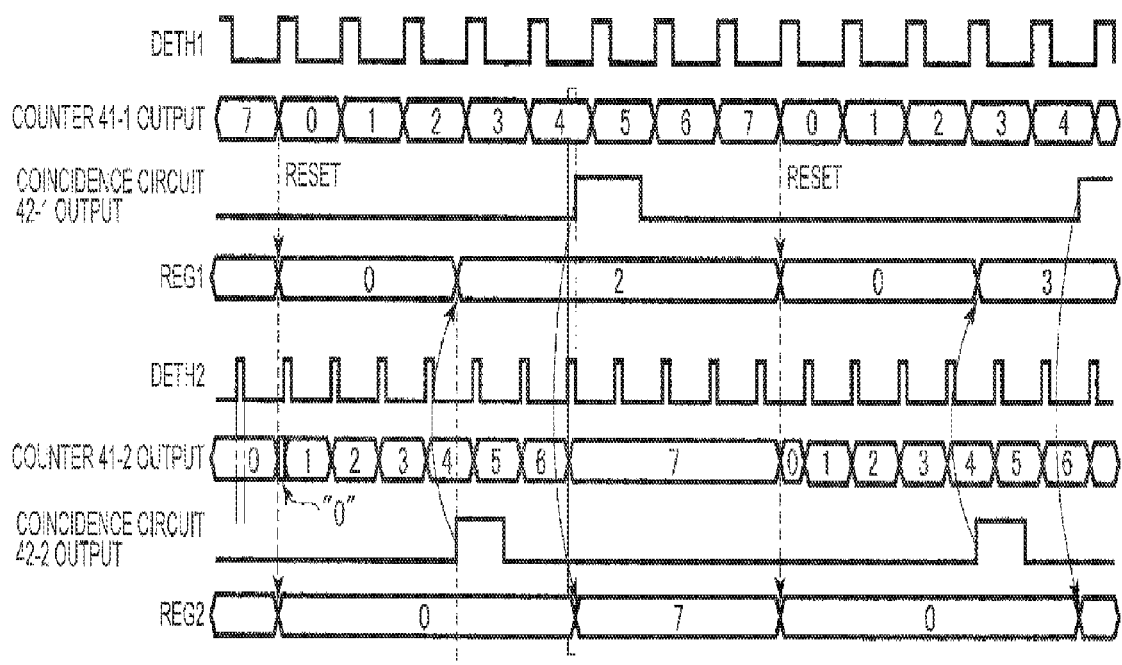
FIG. 9 is a timing chart showing the operation of the comparator circuit of one embodiment for the case when a significant difference was detected between the frequencies of the (two) clock signals.
Figure 10:
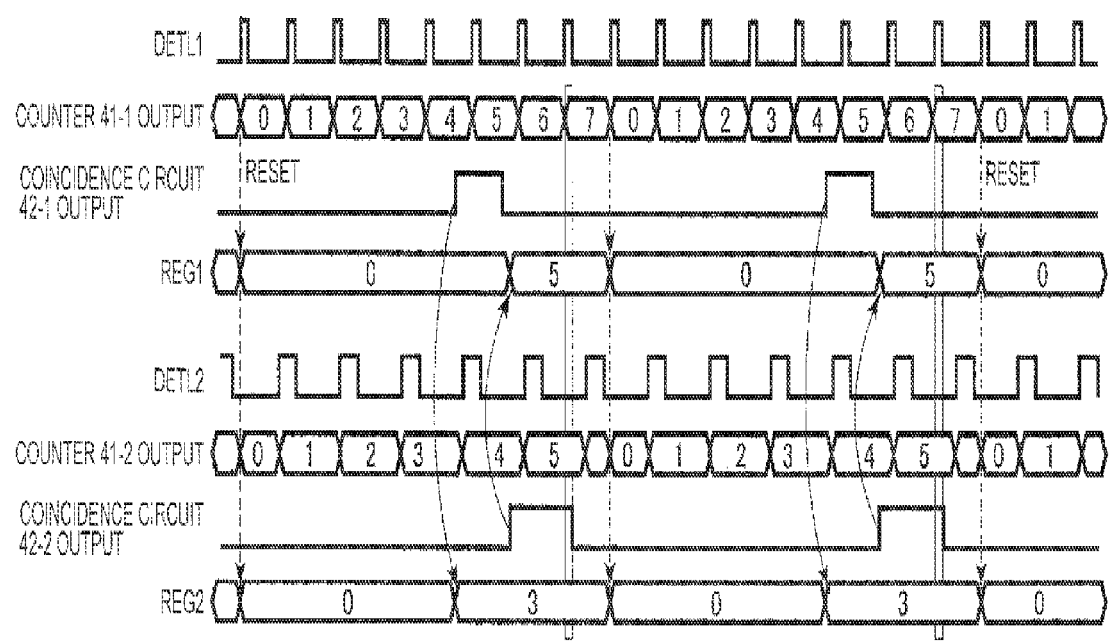
FIG. 10 is a timing chart showing the operation of the comparator circuit of one embodiment for the case when a significant difference was detected between the frequencies of the (two) clock signals.

FIG. 8A, FIG. 8B, FIG. 9, and FIG. 10 are timing charts showing examples of the operation of the comparator circuit 5. FIG. 8A and FIG. 8B show here the operation of the comparator circuit 5 when no significant difference was detected in the frequencies of the clock signals OSC1, OSC2. More specifically, FIG. 8A shows the operation of the comparator circuit 5 when the frequency of the clock signal OSC1 is slightly higher than the frequency of the clock signal OSC2; and FIG. 8B shows the operation of the comparator circuit 5 when the frequency of the clock signal OSC1 is slightly lower than the frequency of the clock signal OSC2. FIG. 9 shows the operation of the comparator circuit 5 when the frequency of the clock signal OSC2 was detected as significantly higher than the frequency of the clock signal OSC1. FIG. 10 shows the operation of the comparator circuit 5 when the frequency of the clock signal OSC1 was detected as significantly higher than the frequency of the clock signal OSC2.

The counters 41-1, 41-2 each perform counting operations to count the pulses of the detection signals DETH1, DETH2. The counting operation successively increases the output of the counters 41-1, 41-2 or namely the counter values. If the frequencies of the clock signals OSC1, OSC2 is lower than the upper limit frequency $f_H$, the frequencies of the detection signals DETH1, DETH2 are a match to the frequency of the clock signal OSC1, OSC2 so that the higher the frequencies of the clock signals OSC1, OSC2, the faster the increase in the respective counter values of the counters 41-1, 41-2. The value of the selection signal SEL output from the comparator circuit 5 is set according to the speed of the increase in the respective counter values of the counters 41-1, 41-2.

In the example in FIG. 8A, when the counter value on the counter 41-1 is "4", the output signal from the coincidence circuit 42-1 transitions to high level in synchronization with the fall in the clock signal OSC1, and the register 44-2 latches the counter value of the counter 41-2. In the example in FIG. 8A, a value of "4" is set as the register value REG2. Next, when the counter value of the counter 41-2 reaches "4", the output signal from the coincidence circuit 42-2 transitions to high level in synchronization with the fall in the clock signal OSC2, and the register 44-1 latches the counter value of the counter 41-1. In the example in FIG. 8A, a value of "5" is set as the register value REG1. When the counter value of the counter 41-1 afterwards reaches "7", the decision circuit 45 at that point compares the register values REG1 and REG2. In the example in FIG. 8A, the difference between the register values REG1 and REG2 (or namely, REG1−REG2) is "1" so that the selection signal SEL is set to high level. The counters 41-1, 41-2 are also reset in response to the counter value of the counter 41-1 reaching "7". The same operation is subsequently repeated.

In the example in FIG. 8B on the other hand, when the counter value of the counter 41-2 afterwards reaches "4", the output signal from the coincidence circuit 42-2 transitions to high level in synchronization with the fall in the clock signal OSC2 and the register 44-1 latches the counter value of the counter 41-1. In the example in FIG. 8B, a value of "4" is set as the register value REG1. Next, when the counter value of the counter 41-1 reaches "4", the output signal from the coincidence circuit 42-1 transitions to high level in synchronization with the fall in the clock signal OSC1 and the register 44-2 latches the counter value of the counter 41-2. In the example in FIG. 8B, a value of "5" is set as the register value REG2. When the counter value of the counter 41- afterwards reaches "7", the decision circuit 45 at that point compares the register values REG1, REG2. In the example in FIG. 8B, the difference between the register values REG1 and REG2 (or namely REG1−REG2) is "−1" so that the selection signal SEL is set to high level. When the counter value of the counter 41-1 afterwards reaches "7", the counters 41-1 and 41-2 are reset. The same operation is subsequently repeated.

In the example in FIG. 9, when the frequency of the clock signal OSC2 is significantly higher than the frequency of the clock signal OSC1, the counter value of the counter 41-2 reaches "4" faster than the counter value on the counter 41-1. When the counter value of the counter 41-2 reaches "4", the output signal from the coincidence circuit 42-2 transitions to high level in synchronization with the fall in the clock signal OSC2, and the register 44-1 latches the counter value of the counter 41-1. In the example in FIG. 9, a value of "2" is set as the register value REG1. When the counter value of the counter 41-1 subsequently reaches "4", the output signal from the coincidence circuit 42-1 transitions to high level in synchronization with the fall of the clock signal OSC1, and the register 44-2 latches the counter value of the counter 41-2. In the example in FIG. 9, a value of "7" is set as the register value REG2. Moreover, when the counter value of the counter 41-2 reaches "7", the decision circuit 45 at that point compares the register values REG1, REG2. In the example in FIG. 9, there is a difference between the register value REG1, REG2 (or namely, REG1−REG2) is "−5" so that the selection signal SEL is set to high level. When the counter value of the counter 41-1 afterwards reaches "7", the counters 41-1, 41-2 are reset. The same operation is subsequently repeated.

In the example in FIG. 10, on the other hand, when the frequency of the clock signal OSC1 is significantly higher than the frequency of the clock signal OSC2, the counter value of the counter 41-1 reaches "4" faster than the counter value of counter 41-2. When the counter value on the counter 41-1 reaches "4", the output signal from the coincidence circuit 42-1 transitions to high level in synchronization with the fall in the clock signal OSC1, and the register 44-2 latches the counter value of the counter 41-2. In the example in FIG. 10, a value of "3" is set as the register value REG2. Next, when the counter value of the counter 41-2 reaches "4", the output signal from the coincidence circuit 42-2 transitions to high level in synchronization with the fall of the clock signal OSC2, and the register 44-1 latches the counter value of the counter 41-1. In the example in FIG. 10, a value of "5" is set as the register value REG1. When the counter value of the counter 41-1 afterwards reaches "7", the decision circuit 45 at that point compares the register values REG1, REG2. In the example in FIG. 10, the difference between the register value REG1, REG2 (or namely, REG1−REG2) is "2" so that the selector signal SEL is set to low level. The counters 41-1, 41-2 are also reset in response to the counter value of the counter 41-1 reaching "7". The same operation is subsequently repeated.

Referring once again to FIG. 1, the selector 6 contains a function to select one of the clock signals OSC1, OSC2 output from the oscillators 1-1, 1-2 as the output signal CLKOUT in response to the selection signal SEL output from the comparator circuit 5. In addition to the selection signal SEL, the selector 6 selects the output clock signal CLKOUT from among the clock signals OSC1, OSC2 in response to the clock normal signals OSC1GD, OSC2GD that are output from the AND gates 4-1, 4-2. Here, important to note is that the clock normal signal OSC1GD is a signal showing whether or not the frequency of the clock signal OSC1 is within the frequency tolerance range, and the clock normal signal OSC2GD is a signal showing whether or not the frequency of the clock signal OSC2 is within the frequency tolerance range. The selector 6 further generates an oscillator normal operation signal CLKGD showing whether or not the oscillator 1-1, 1-2 is operating normally.

Figures 11, 12, 13:
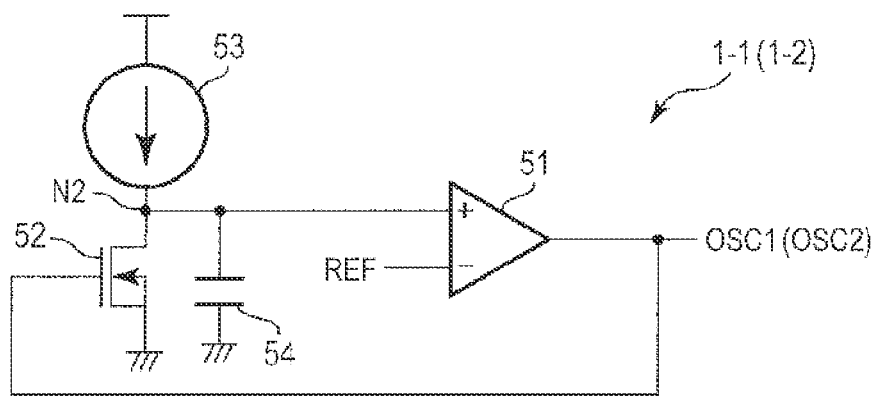
FIG. 11 is a truth table showing the operation of the selector in one embodiment.
FIG. 12 is a circuit diagram showing the structure of the oscillator in a variation of in the present embodiment.
FIG. 13 is a truth table showing the operation of the decision circuit for the comparator circuit for the case when utilizing the oscillator with the structure shown in FIG. 12.

FIG. 11 is a truth table showing the operation of the selector 6. When both of the clock normal signals OSC1GD, OSC2GD are at low level, the selector 6 clamps the output clock signal CLKOUT to low level, and also clamps the oscillator normal operation signal CLKGD to low level, without selecting either of the clock signals OSC1, OSC2 regardless of the selection signal SEL value. Moreover, when the clock normal signal OSC1GD is at low level and the clock normal signal OSC2GD is at high level, the selector 6 selects the clock signal OSC2 as the output clock signal CLKOUT, and further sets the oscillator normal operation signal CLKGD to low level regardless of the selection signal SEL value. However, when the clock normal signal OSC2GD is at low level, and the clock normal signal OSC1GD is at high level, the selector 6 selects the clock signal OSC1 as the output clock signal CLKOUT and further the oscillator normal operation signal CLKGD is set to low level regardless of the value of the selection signal SEL.

When both of the clock normal signals OSC1GD, OSC2GD are at high level, the selector 6 selects either of the clock signals OSC1, OSC2 as the output clock signal CLKOUT according to the selection signal SEL value. More specifically, when the selection signal SEL is at high level, the selector 6 selects the clock signal OSC1 as the output clock signal CLKOUT. However, when the selection signal SEL is at low level, the selector 6 selects the clock signal OSC2 as the output clock signal CLKOUT. Here, the selector 6 sets the oscillator normal operation signal CLKGD to high level when both the clock normal signals OSC1GD, OSC2GD are at high level.

The output clock signal CLKOUT is selected by this type of operation as described next. First of all, when both the frequencies of the clock signals OSC1, OSC2 are within the frequency tolerance range, the low frequency among the clock signals OSC1, OSC2 is selected as the output clock signal CLKOUT. More precisely, when a low frequency of the clock signal OSC1 is detected among the clock signals OSC1, OSC2, the clock signal OSC1 is selected as the output clock signal CLKOUT. Also, the clock signal OSC1 is selected as the output clock signal CLKOUT, even in the case where the frequencies of the clock signals OSC1, OSC2 are equivalent. On the other hand, the clock signal OSC2 is selected as the output clock signal CLKOUT, when a low frequency of the clock signal OSC2 was detected among the clock signals OSC1, OSC2.

When one of either of the clock signals OSC1, OSC2 is within the frequency tolerance range, and the other is not within the frequency tolerance range, the clock signal that is within the frequency tolerance range is selected as the output clock signal CLKOUT. Moreover, when both of the clock signals OSC1, OSC2 are not within the frequency tolerance range, neither of the clock signals OSC1, OSC2 is selected as the output clock signal CLKOUT, and the output clock signal CLKOUT is clamped to the specified state (in the present embodiment, low level).

The oscillator normal operation signal CLKGD is set to low level when at least one of either frequency of the clock signals OSC1, OSC2 is not within the frequency tolerance range. When both frequencies of the clock signals OSC1, OSC2 are within the frequency tolerance range, the oscillator normal operation signal CLKGD is set to high level.

In the clock generator circuit utilizing the structure and the operation described above, the frequencies of the clock signal OSC1, OSC2 are compared, and the output clock signal CLKOUT is selected from among the clock signals OSC1, OSC2 according to the results of that comparison. A more appropriate clock signal with a structure containing just two oscillators can therefore be selected. The clock signals OSC1, OSC2 are at this time judged as within the frequency tolerance range or not so that adjustments can be made in case of excessive fluctuations in the frequency of the clock signals OSC1, OSC2. The clock generator circuit of the present embodiment can therefore simultaneously satisfy the need to reduce the number of oscillators, and the need to deal with excessive fluctuations in the oscillation frequency.

Here, in the present embodiment, while the oscillators 1-1, 1-2 are structured so that the oscillation frequency (namely, the frequency of the clock signals OSC1, OSC2) rises due to deterioration from long-term operation, the selector 6 selects a clock signal having a low frequency. A clock signal generated by an oscillator having small deterioration can therefore be output as the output clock signal CLKOUT.

In the structure of the integrated circuit device and the monitor circuits 3-1, 3-2 of the above described embodiment (See FIG. 1, FIG. 5), the monitor circuit 3-1 monitors whether or not the frequency of the clock signal OSC2 is higher than the upper limit frequency $f_H$, based on the detection signal DETH1; and the monitor circuit 3-2 monitors whether or not the frequency of the clock signal OSC1 is higher than the upper limit frequency $f_H$, based on the detection signal DETH2. The structure of the integrated circuit device and the structure of the monitor circuits 3-1, 3-2 may be changed so that the monitor circuit 3-1 monitors the clock signal OSC1 based on the detection signal DETH1, and the monitor circuit 3-2 monitors the clock signal OSC2 based on the detection signal DETH2.

Figure 18:
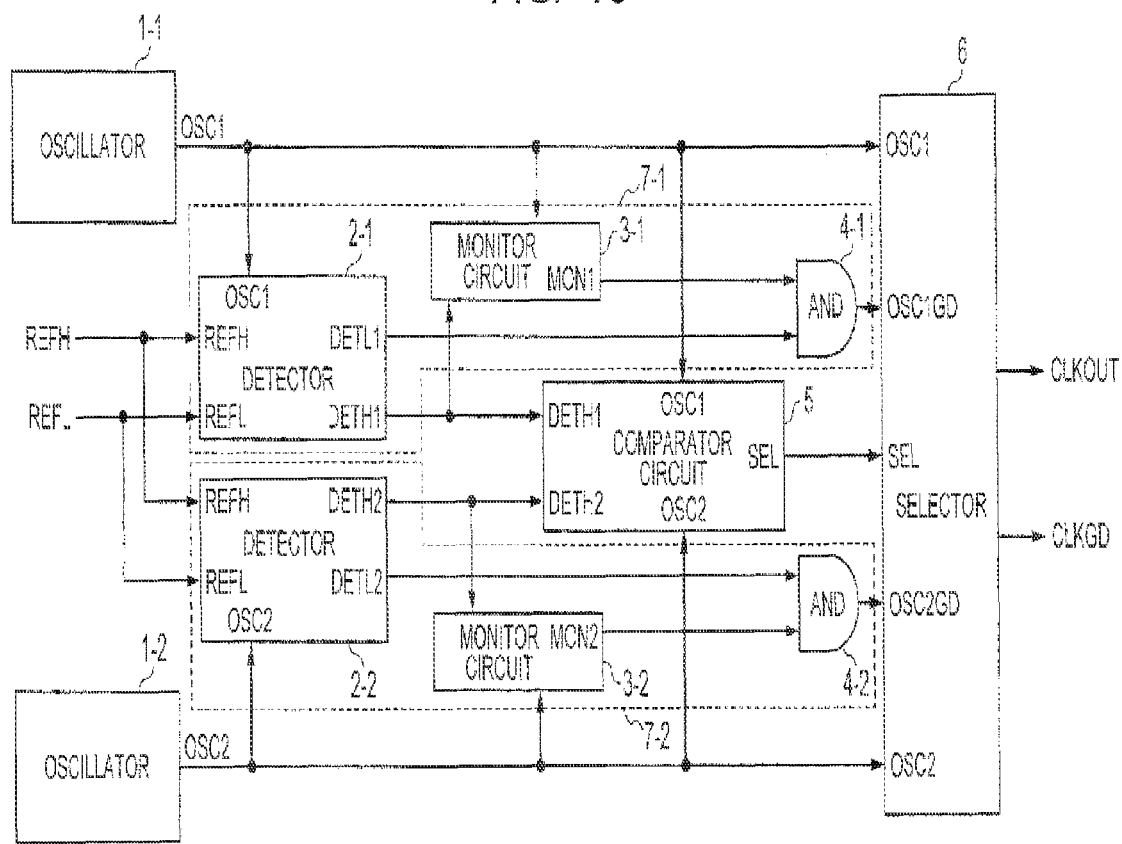
FIG. 18 is a block diagram showing a variation of the integrated circuit device with the structure in FIG. 1.
Figure 19:
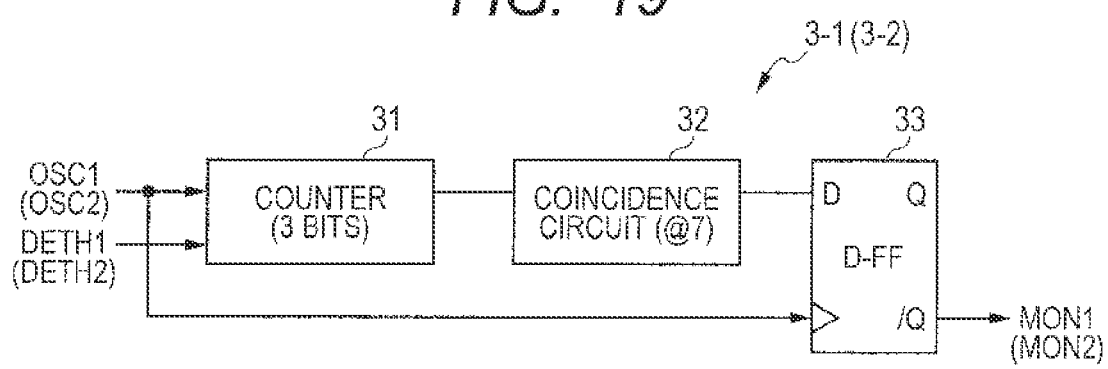
FIG. 19 is a block diagram showing the structure of the monitor circuit utilized in the integrated circuit device of the structure in FIG. 18.

FIG. 18 is a block diagram showing a variation of the integrated circuit device with the structure in FIG. 1. FIG. 19 is a block diagram showing the structure of the monitor circuits 3-1, 3-2 utilized in the integrated circuit device of the structure in FIG. 18. In the example in this variation, the monitor circuit 3-1 monitors the frequency of the clock signal OSC1 by way of the detection signal DETH1 generated based on the clock signal OSC1; and the monitor circuit 3-2 monitors the frequency of the clock signal OSC2 by way of the detection signal DETH2 generated based on the clock signal OSC2. In other words, the other clock signal OSC2 is not required in order to monitor whether or not the frequency of the clock signal OSC1 is higher than the upper limit frequency $f_H$. The reverse of this case is also the same. For example when one clock signal (OSC1 or OSC2) is stopped, the structure of the monitor circuits in FIG. 1 and FIG. 5 might not be capable of detecting a high state (abnormality) when the other clock signal is higher than the upper limit frequency $f_H$. However, in the structure of the integrated circuit device of FIG. 18 and the monitor circuits in FIG. 19, even if one of the clock signals (OSC1 or OSC2) is in a stopped state, the monitor circuit can monitor whether or not the remaining clock signal has not been reached the upper limit frequency $f_H$. An output clock signal CLKOUT with higher reliability can therefore be achieved.

The above described embodiment may also employ an oscillator to serve as the oscillators 1-1, 1-2 configured so that the oscillation frequency (namely, the frequency of the clock signals OSC1, OSC2) drops due to deterioration from long-term operation. FIG. 12 is a circuit diagram showing an example of the structure of the oscillator that the oscillation frequency drops due to deterioration from long-term operation. In the structure in FIG. 12, the oscillators 1-2 contains an operational amplifier 51, an NMOS transistor 52, a constant current source 53, and a capacitor element 54. The non-inverting input of the operational amplifier 51 is coupled to the node N2, and the reference voltage potential REF is supplied to the inverting input. The gate of the NMOS transistor 52 is coupled to the output of the operational amplifier 51, the source is coupled to the ground terminal, and the drain is coupled to the node N2. The constant current source 53 is coupled across the power supply terminal and the node N2, and the capacitor element 54 is coupled to the node N2 and the ground terminal. When an oscillator configured in this way is utilized as the oscillators 1-1, 1-2, the output signal from the operational amplifier 51 is utilized as the clock signal OSC1 or OSC2. In addition to the capacitance value of the capacitor element 54, the frequency of the oscillator configured as shown in FIG. 12, is also dependent on the off-leak current of the NMOS transistor 52 and the size of the current of the constant current source 53. Deterioration causes the off-leak current of the NMOS transistor 52 to increase and the size of the current of the constant current source 53 to decrease, and the oscillator frequency becomes lower if the extent of this deterioration becomes more dominant than the capacitor element 54. In other words, in the oscillator having the structure in FIG. 12, if the off-leak current of the NMOS transistor 52 increases and the size of the current of the constant current source 53 decreases due to deterioration from long-term operation, and if the extent of the lowering of the oscillation frequency drops due to these effects is larger than the extent of the increase in the oscillation frequency due to the increased capacitance value in the capacitor element 54, the oscillation frequency will consequently drop. In this case, the drop signifies that the deterioration in the oscillator will gradually worsen when the frequency of the clock signal output is low.

When utilizing an oscillator with the above type of structure, the logic to generate a selection signal SEL in the decision circuit 45 of comparator circuit 5 is changed so that the selector 6 selects a clock signal with a high frequency (clock signal generated by the oscillator with small deterioration) as the output clock signal CLKOUT.

FIG. 13 is a truth table showing the operation of the decision circuit 45 for the case where utilizing oscillators structured so that the oscillation frequency drops due to deterioration from long-term operation, as the oscillators 1-1, 1-2. The selection signal SEL is set to the low level when the value of REG1−REG2 is the second threshold value, or more specifically is −2 or less. On the other hand, the selection signal SEL is set to the high level when the value of REG1−REG2 is larger than the second threshold value, and smaller than the first threshold value, or more specifically the REG1−REG2 value is −1 or more and also 1 or less. Also, the selection signal SEL is set to the high level when the REG1−REG2 value is larger than the first threshold value or more, or stated more specifically the REG1−REG2 value is 2 or more.

Here, a REG1−REG2 value that is 2 or more, signifies that the frequency of the clock signal OSC1 was detected as significantly higher than the frequency of the clock signal OSC2 (namely, the deterioration in the oscillator 1-1 generating the clock signal OSC1 is small). A REG1−REG2 value that is −2 or less signifies that the frequency of the clock signal OSC2 was detected as significantly higher than the frequency of the clock signal OSC1 (namely, the deterioration in the oscillator 1-2 generating the clock signal OSC2 is small). A REG1−REG2 value that is −1 or more and 1 or less, signifies that no significant difference was detected between the clock signals OSC1, OSC2. The selector 6 selects the clock signal with the high frequency, or namely selects the clock signal generated by the oscillator having small deterioration according to the selection signal SEL.

A decision circuit 45 that operates in this way is capable of selecting a clock signal generated by the oscillator having small deterioration as the output clock signal CLKOUT, when using oscillators configured so that the oscillation frequency drops due to deterioration from long-term operation.

Figure 14:
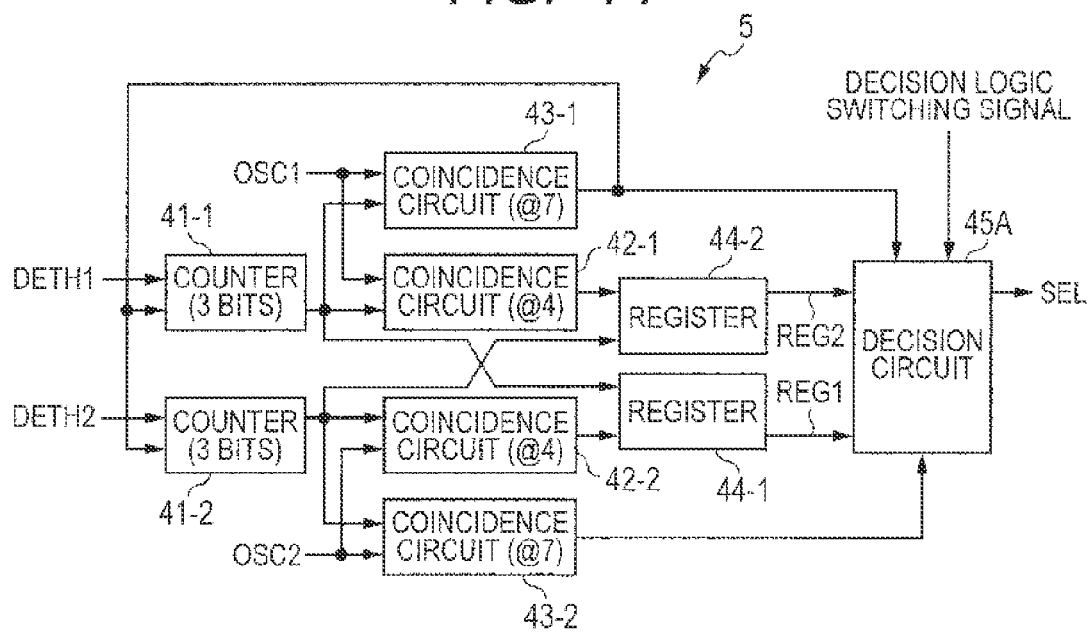
FIG. 14 is a circuit diagram showing the structure of the decision circuit for the comparator circuit in another variation of the present embodiment.

In another variation as shown in FIG. 14, a decision circuit 45A configured to allow switching of the logic for generating the selection signal SEL according to a decision logic switching signal may be utilized in the comparator circuit 5. The decision circuit 45A may operate by either the logic shown in FIG. 7 or the logic shown in FIG. 13 according to the state of the decision logic switching signal. Setting the decision logic switching signal allows switching the mutual relation between the results from comparing the frequency of the clock signal OSC1 and frequency of the clock signal OSC2, and the clock signal selected by the selection signal SEL. When the deterioration mode of the oscillators 1-1, 1-2 is unclear during the design stage, this type of structure allows setting the state of the decision logic switching signal according to the deterioration mode that was found by reliability tests of the actual device or by other methods, so that a clock signal generated by the oscillator having small deterioration can be selected as the output clock signal CLKOUT.

Figure 15:
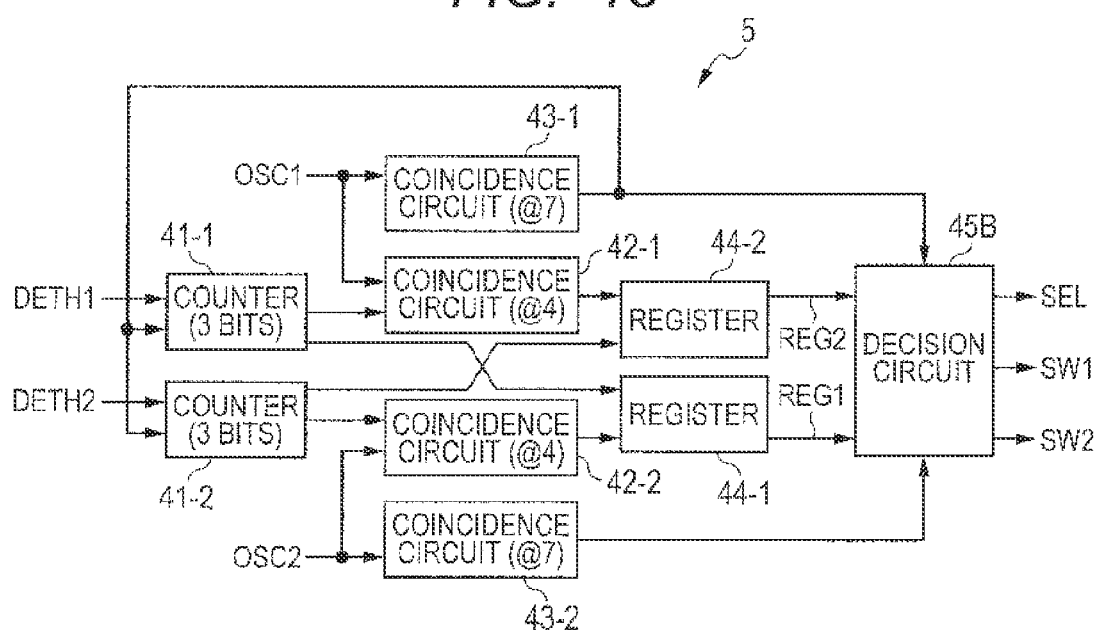
FIG. 15 is a circuit diagram showing the structure of the decision circuit for the comparator circuit in still another variation of the present embodiment.

In still another variation as shown in FIG. 15, a decision circuit 45B may be utilized to generate the control signals SW1, SW2 to report that the frequency fluctuation in the clock signal OSC1, OSC2 (in other words, deterioration in the oscillators 1-1, 1-2) was detected to the oscillators 1-1, 1-2, in the comparator circuit 5. In this case, the oscillators 1-1, 1-2 are configured to allow switching of circuit elements that tend to easily deteriorate among the circuit elements relating to oscillation operation according to the control signals SW1, SW2.

Figures 16, 17:
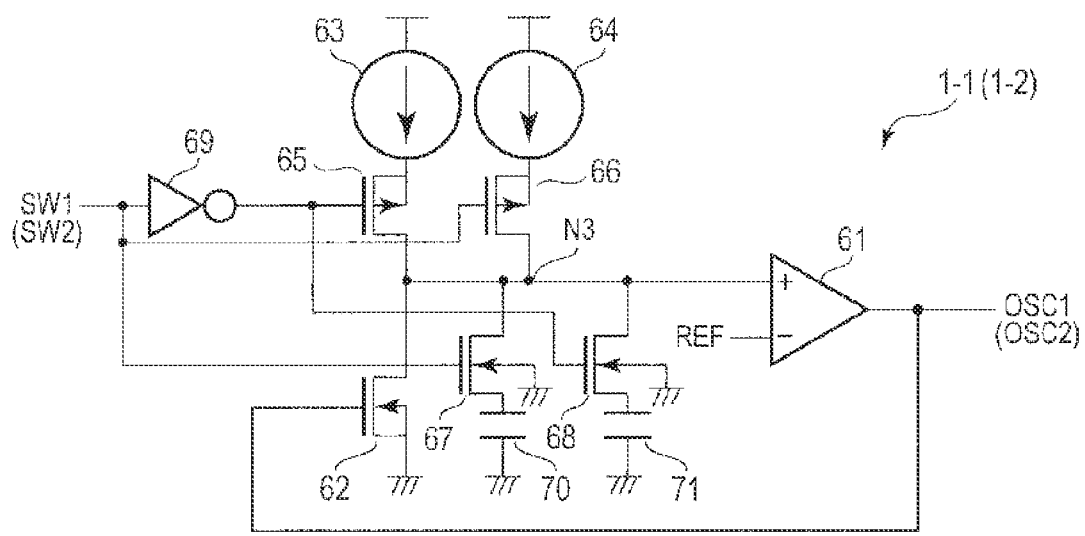
FIG. 16 is a circuit diagram showing the structure of the oscillator in still another variation.
FIG. 17 is a truth table showing the operation of the decision circuit for the comparator circuit in still another variation.

FIG. 16 is a circuit diagram showing an example of the structure of the oscillator 1-1 configured to allow switching of the internally used circuit elements in response to the control signal SW1. The oscillator 1-1 shown in FIG. 16 includes an operational amplifier 61, an NMOS transistor 62, constant current sources 63, 64, PMOS transistors 65, 66, NMOS transistors 67, 68, an inverter 69, and capacitor elements 70, 71. The non-inverting input of the operational amplifier 61 is coupled to node N3, and the reference voltage potential REF is supplied to the non-inverting input. The gate of the NMOS transistor 62 is coupled to the output of the operational amplifier 61, the source is coupled to the ground terminal, and the drain is coupled to the node N3. The constant current source 63 and PMOS transistor 65 are coupled in series between the power supply terminal and the node N3; and the constant current source 64 and PMOS transistor 66 are coupled in parallel with the constant current source 63 and the PMOS transistor 65, and also coupled in series between the power supply terminal and the node N3. The PMOS transistors 65, 66 both operate as switching elements operated in response to the control signal SW1, and function as selectors to select the constant current sources 63, 64. The NMOS transistor 67 and capacitor element 70 are coupled in series between the node N3 and the ground terminal; the NMOS transistor 68 and capacitor element 71 are coupled in parallel with the NMOS transistor 67 and the capacitor element 70, and also coupled in series between node N3 and the ground terminal. The NMOS transistors 67, 68 are both operated as switching elements operating in response to the control signal SW1, and function as selectors to select the capacitor elements 70, 71.

The control signal SW1 that controls the operation of the oscillator 1-1, is supplied to the gate of the PMOS transistor and the gate of the NMOS transistor 67. Moreover, the inverter 69 generates an inverted signal of the control signal SW1 that is supplied to the gate of the PMOS transistor 65 and the gate of the NMOS transistor 68. When the control signal SW1 reaches the high level, the PMOS transistor 65 and NMOS transistor 67 reach the ON state, and the PMOS transistor 66 and NMOS transistor 68 reach the OFF state. Consequently the constant current source 63 and the capacitor element 70 are electrically coupled to the node N3; and oscillation is carried out by the operational amplifier 61, the NMOS transistor 62, the constant current source 63, and the capacitor element 70. At this time, the constant current source 64 and the capacitor element 71 are cut off from the node N3 and do not contribute to the oscillation of the oscillator 1-1. On the other hand when the control signal SW1 reaches low level, the PMOS transistor 65, and the NMOS transistor 67 reach the OFF state, and the PMOS transistor 66 and NMOS transistor 68 reach the ON state. Consequently, the constant current source 64, the capacitor element 71 are electrically coupled to the node N3, the constant current source 64 and capacitor element 71 are utilized instead of the constant current source 63 and capacitor element 70, and he oscillator 1-1 oscillates. Namely, in the oscillator 1-1 with the structure of FIG. 16, the control signal SW1 allows selecting a pair for use in the oscillation operation from among the pair of the constant current source 63 and capacitor element 70; or the pair of the constant current source 64 and the capacitor element 71.

Also, by utilizing an oscillator with structure in FIG. 16, for the oscillator 1-2 in the same way, a pair for use in the oscillation operation can be selected from among the constant current source 63 and capacitor element 70, or the pair of the constant current source 64 and the capacitor element 71 in response to the control signal SW2.

FIG. 17 is a truth table showing the operation of the decision circuit 45B in the comparator circuit 5 when utilizing an oscillator having the structure shown in FIG. 16. A REG1–REG2 value that is the first threshold value, or more specifically is "2" or more, signifies that the frequency of the clock signal OSC1 generated by the oscillator 1-1 was detected as significantly high. In this case, the selection signal SEL is set to low level and a clock signal OSC2 generated by the oscillator 1-2 is selected. Moreover, the pair of the constant current source and the capacitor that are utilized in the oscillator 1-1 is switched by setting the control signal SW1 to low level.

On the other hand, a REG1–REG2 value that is smaller than the first threshold value and larger than the second threshold value which is smaller than the first threshold value, or more specifically a REG1–REG2 value that is "−1" or more and "1" or less signifies that no significant difference was detected between the frequencies of the clock signals OSC1 and OSC2. In this case, the selection signal SEL is set to high level and the clock signal OSC1 generated by the oscillator 1-1 is selected.

A REG1–REG2 value that is smaller than the second threshold value or more specifically a REG1–REG2 value that is "−2" or less signifies that the frequency of the clock signal OSC2 generated by the oscillator 1-2 was detected as significantly high. In this case, the selection signal SEL is set to high level and the clock signal OSC1 generated by the oscillator 1-1 is selected. Also, the pair of the constant current source and the capacitor utilized in the oscillator 1-2 is switched by setting the control signal SW2 to low level.

In the operation shown in FIG. 17, an operation can be performed to handle the frequency rise caused by deterioration in the capacitor elements 70, 71. The capacitor element and the constant current source are switched, by switching the control signal (SW1 or SW2) supplied to the oscillator generating a clock signal whose frequency is high among the oscillators 1-1, 1-2 from high level to low level. The oscillator having a high frequency among the oscillators 1-1, 1-2 can in this way be restored to the original state.

Restated in other words, when the REG1–REG2 value is "2" or more, along with setting the selection signal SEL to low level in order to select a more correct clock signal OSC2, the control signal SW1 set to low level in order to lower the frequency of the clock signal OSC1, and the pair of the constant current source and the capacitor utilized in the oscillator 1-1 is switched. Conversely, when the REG1–REG2 value is "−2" or less, along with setting the selection signal SEL to high level in order to select a more correct clock signal OSC1, the control signal SW2 is set to low level in order to lower the frequency of the clock signal OSC2, and the pair of the constant current source and the capacitor utilized in the oscillator 1-2 is switched. In other words, the service life can be extended by selecting an oscillator having a normal (correct) frequency and also by switching to a pair of constant current source and capacitor of the oscillator having a high frequency to achieve a near normal status. When the REG1–REG2 value is "−1 to 1", the frequencies of the clock signal OSC1 and OSC2 are approximately the same so that the relevant accuracy is high and both can be judged as normal. Therefore, no switching of the constant current source and capacitor pair is required so the control signal SW1 and SW2 can all be kept unchanged at high level. Also, either of the clock signals OSC1 and OSC2 may be selected but in this case the clock signal OSC1 was selected so the selection signal SEL is at high level.

The invention rendered by the inventors was specifically described above based on the embodiment, however the present invention is not limited to the examples in the embodiment and needless to say, all manner of variations and adaptations not departing from the spirit and scope of the present invention are allowed.

What is claimed is:

1. An integrated circuit device for use in an automobile, the integrated circuit device comprising:
   a first oscillator configured to generate a first clock signal;
   a second oscillator configured to generate a second clock signal;
   a comparator circuit configured to compare a frequency of the first clock signal with a frequency of the second clock signal, and configured to generate a selection signal for selecting either the first clock signal or the second clock signal; and
   a selector configured to output an output clock signal that is selected from among a plurality of outputs including the first clock signal and the second clock signal in response to the selection signal.

2. The integrated circuit device according to claim 1, further comprising:
   a first frequency monitor unit configured to monitor whether or not the frequency of the first clock signal is within a specified frequency tolerance range, and configured to generate a first clock normal signal indicating whether or not the frequency of the first clock signal is within the specified frequency tolerance range; and
   a second frequency monitor unit configured to monitor whether or not the frequency of the second clock signal is within the specified frequency tolerance range, and configured to generate a second clock normal signal indicating whether or not the frequency of the second clock signal is within the specified frequency tolerance range.

3. The integrated circuit device according to claim 2, wherein the selector is configured to output the output clock signal according to the first clock normal signal, the second clock normal signal, and the selection signal.

4. The integrated circuit device according to claim 2, wherein the selector is configured to select the first clock signal as the output clock signal, in response to the frequency of the second clock signal being outside of the specified frequency tolerance range and the frequency of the first clock signal being within the specified frequency tolerance range.

5. The integrated circuit device according to claim 2, wherein the selector is configured to clamp the output clock signal at a specified state, in response to neither of the frequency of the first clock signal and the frequency of the second clock signal being within the specified frequency tolerance range.

6. The integrated circuit device according to claim 1, wherein the integrated circuit has a total of two oscillators.

7. An integrated circuit device comprising:
   a total of two oscillators including a first oscillator that outputs a first clock signal and a second oscillator that outputs a second clock signal;
   a comparator circuit configured to compare a frequency of the first clock signal with a frequency of the second clock signal, and configured to generate a selection signal indicating a selection of an output signal from among a plurality of signals including the first clock signal and the second clock signal; and
   a selector configured to output the output signal in response to the selection signal.

8. The integrated circuit device according to claim 7, wherein in response to the frequency of the first clock signal being within a specified frequency tolerance range and the frequency of the second clock signal being outside of the specified frequency tolerance range, the output signal is the first clock signal.

9. The integrated circuit device according to claim 8, wherein in response to the frequency of the first clock signal being outside of the specified frequency tolerance range and the frequency of the second clock signal being within the specified frequency tolerance range, the output signal is the second clock signal.

10. The integrated circuit device according to claim 9, wherein in response to the frequency of the first clock signal and the frequency of the second clock signal both being outside of the specified frequency tolerance range, the output signal is clamped as a specified state.

11. A device that generates a first clock signal and a second clock signal, the device comprising:
    a selector configured to output an output signal having a frequency that depends on a frequency of the first clock signal and a frequency of the second clock signal,
    wherein in response to neither of the frequency of the first clock signal and the frequency of the second clock signal being abnormal, the frequency of the output signal is a first frequency,
    wherein in response to one of the frequency of the first clock signal and the frequency of the second clock signal being abnormal, the frequency of the output signal is a second frequency, different from the first frequency, and
    wherein in response to both the frequency of the first clock signal and the frequency of the second clock signal being abnormal, the output signal is a third frequency, different from the first frequency and the second frequency.

12. The device according to claim 11, wherein the first frequency is the same as the frequency of the second clock signal, in response to the frequency of the first clock signal being higher than the frequency of the second clock signal.

13. The device according to claim 12, wherein the first frequency is the same as the frequency of the first clock signal, in response to the frequency of the first clock signal being lower than the frequency of the second clock signal.

14. The device according to claim 12, wherein in response to the frequency of the second clock signal being abnormal and the frequency of the first clock signal being normal, the output signal has a same frequency as the first clock signal.

15. The device according to claim 14, wherein in response to the frequency of the first clock signal being abnormal and the frequency of the second clock signal being normal, the output signal has a same frequency as the second clock signal.

16. The device according to claim 11, wherein the device has a total of two oscillators.

* * * * *